United States Patent
Chien et al.

(10) Patent No.: US 12,246,404 B2
(45) Date of Patent: *Mar. 11, 2025

(54) DEVICE MAINTENANCE IN SEMICONDUCTOR MANUFACTURING ENVIRONMENT

(71) Applicant: TAIWAN SEMICONDUCTOR MANUFACTURING COMPANY LIMITED, Hsin-Chu (TW)

(72) Inventors: Vincent Chien, New Taipei (TW); Shih Yi-Cheng, Zhubei (TW); Hill Liao, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,239

(22) Filed: Nov. 22, 2023

(65) Prior Publication Data
US 2024/0082964 A1  Mar. 14, 2024

Related U.S. Application Data

(62) Division of application No. 17/873,268, filed on Jul. 26, 2022, now Pat. No. 11,850,692, which is a
(Continued)

(51) Int. Cl.
*H01L 21/67* (2006.01)
*B08B 5/04* (2006.01)
(Continued)

(52) U.S. Cl.
CPC ............ *B23P 6/00* (2013.01); *B08B 5/043* (2013.01); *B08B 13/00* (2013.01); *H01L 21/67155* (2013.01); *H01L 21/67703* (2013.01); *H01L 21/67724* (2013.01); *H01L 21/67745* (2013.01); *B08B 3/02* (2013.01); *B08B 5/02* (2013.01); *B08B 5/04* (2013.01)

(58) Field of Classification Search
CPC ..................................................... B65G 45/22
See application file for complete search history.

(56) References Cited

U.S. PATENT DOCUMENTS

2010/0242783 A1  9/2010  Oguro et al.
2011/0251735 A1  10/2011  Hayashi
(Continued)

*Primary Examiner* — Marc Lorenzi
(74) *Attorney, Agent, or Firm* — Cooper Legal Group, LLC

(57) ABSTRACT

A system for maintaining a device in a semiconductor manufacturing environment that includes a controller configured to determine a distance travelled by the device within the semiconductor manufacturing environment, where the device has a feature that selectively engages a carrier configured to carry a semiconductor wafer such that the device moves the semiconductor wafer to different processing stations within the semiconductor manufacturing environment. The system also includes an inspection component configured to inspect the device responsive to the distance travelled by the device exceeding a distance threshold, a repair component configured to repair the device responsive to a repair indication from at least one of the controller or the inspection component, and a cleaning component configured to clean the device responsive to a clean indication from at least one of the controller or the inspection component.

20 Claims, 6 Drawing Sheets

Related U.S. Application Data division of application No. 16/415,097, filed on May 17, 2019, now Pat. No. 11,819,965.

(51) Int. Cl.
  *B08B 13/00* (2006.01)
  *B23P 6/00* (2006.01)
  *H01L 21/677* (2006.01)
  *B08B 3/02* (2006.01)
  *B08B 5/02* (2006.01)

(56) References Cited

U.S. PATENT DOCUMENTS

| | | |
|---|---|---|
| 2012/0101667 A1 | 4/2012 | Ikeya et al. |
| 2015/0020343 A1 | 1/2015 | Shibata et al. |
| 2017/0166406 A1 | 6/2017 | Horii et al. |
| 2019/0131119 A1 | 5/2019 | Wang et al. |

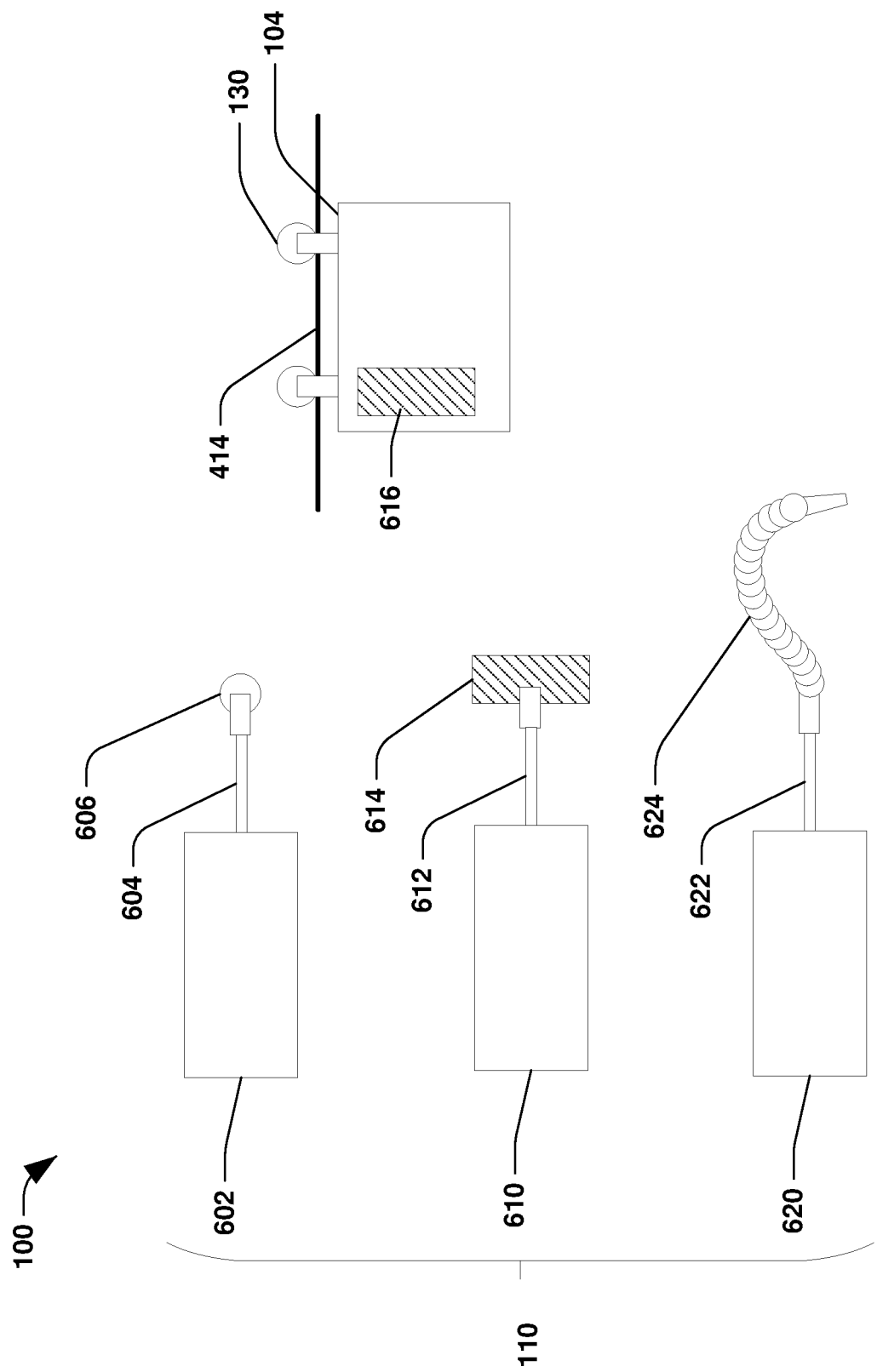

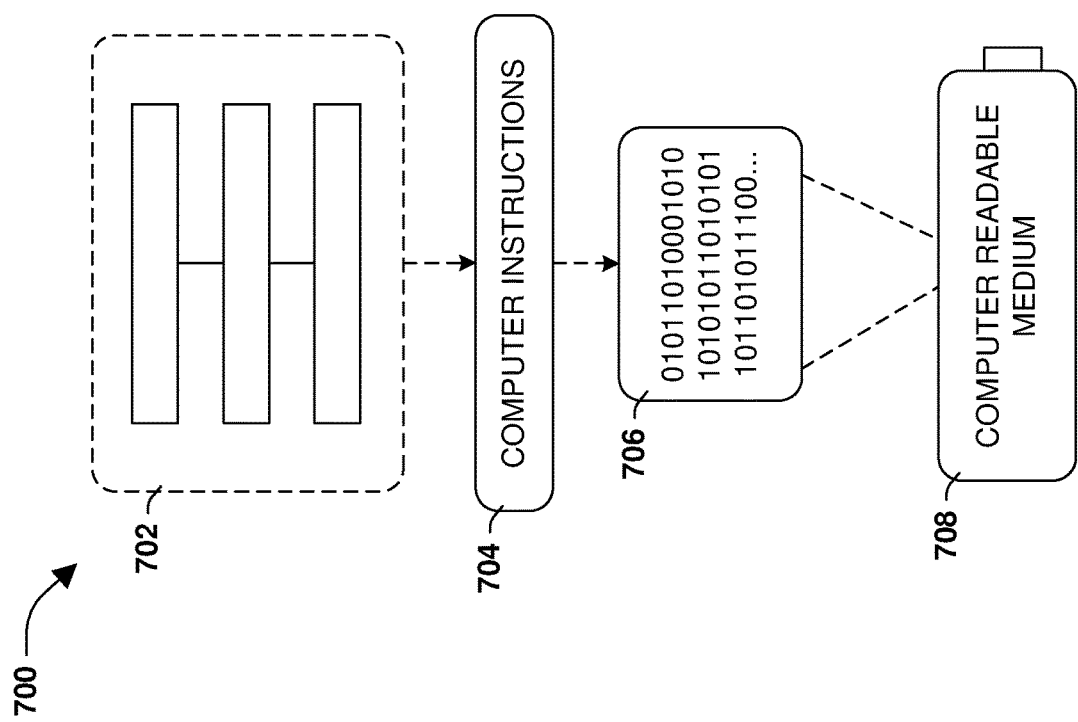

DEVICE MAINTENANCE IN SEMICONDUCTOR MANUFACTURING ENVIRONMENT

RELATED APPLICATIONS

This application is a divisional of and claims priority to U.S. patent application Ser. No. 17/873,268, titled "DEVICE MAINTENANCE IN SEMICONDUCTOR MANUFACTURING ENVIRONMENT" and filed on Jul. 26, 2022, which is a divisional of and claims priority to U.S. patent application Ser. No. 16/415,097, titled "DEVICE MAINTENANCE IN SEMICONDUCTOR MANUFACTURING ENVIRONMENT" and filed on May 17, 2019. U.S. patent application Ser. No. 17/873,268 and U.S. patent application Ser. No. 16/415,097 are incorporated herein by reference.

BACKGROUND

Semiconductor arrangements are generally formed on or from a semiconductor wafer that is subjected to different semiconductor fabrication processes. The different semiconductor fabrication processes are performed at various stations in a semiconductor manufacturing environment. The semiconductor wafer is moved between the various stations by conveyance mechanisms within the semiconductor manufacturing environment.

BRIEF DESCRIPTION OF THE DRAWINGS

Aspects of the present disclosure are best understood from the following detailed description when read with the accompanying FIGS. It is noted that, in accordance with the standard practice in the industry, various features are not drawn to scale. In fact, the dimensions of the various features may be arbitrarily increased or reduced for clarity of discussion.

FIG. 6 illustrates a repair component having several repair tools, according to some embodiments.

FIG. 7 illustrates an example computer-readable medium wherein processor-executable instructions configured to embody one or more of the provisions set forth herein may be comprised, according to some embodiments.

DETAILED DESCRIPTION

Figure 1:
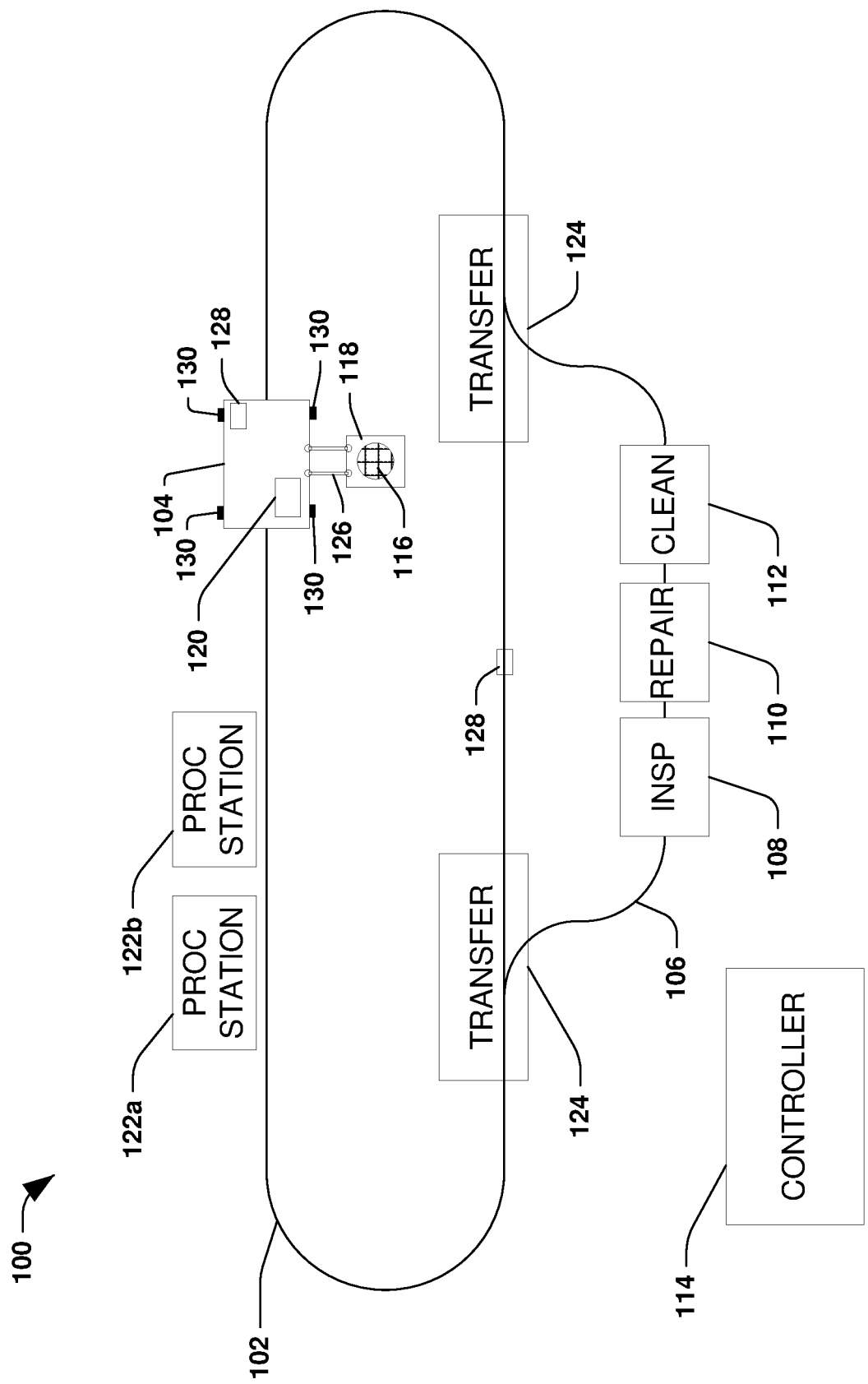
FIG. 1 illustrates a system for maintaining a device used for moving semiconductor wafers in a semiconductor manufacturing environment, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Some embodiments relate to a system for maintaining a device in a semiconductor manufacturing environment. The device moves on or relative to a track within the semiconductor manufacturing environment. The device conveys one or more semiconductor wafers between various stations within the semiconductor manufacturing environment to expose the wafers to different semiconductor fabrication processes. As the device moves within the semiconductor manufacturing environment one or more components of the device wear, such as wheels of the device that contact the track. According to some embodiments, the device is inspected after travelling a certain distance, such as a distance likely to result in wear of the device. Inspecting the device based upon distance travelled inhibits unnecessary inspections, such as where the device is inspected too frequently or before the device is likely to exhibit wear. Inspecting the device based upon distance travelled promotes timely inspections, such as where substantial use of the device occurs in a relatively short period of time such that the device likely exhibits wear in a compressed timeframe.

The system includes a controller configured to determine a distance travelled by the device within the semiconductor manufacturing environment, where the device has a feature that selectively engages a carrier configured to carry a semiconductor wafer such that the device moves the semiconductor wafer to different processing stations within the semiconductor manufacturing environment. The system includes an inspection component configured to inspect the device responsive to the distance travelled by the device exceeding a distance threshold. The system includes a repair component configured to repair the device responsive to a repair indication from the inspection component and a cleaning component configured to clean the device responsive to a clean indication from the inspection component.

FIG. 1 illustrates a system 100 for maintaining a device 104 used for moving a semiconductor wafer 116 in a semiconductor manufacturing environment, according to some embodiments. In some embodiments, although a singular wafer is referenced one or more wafers are contemplated, such as being moved, carried, operated on, etc. in the semiconductor manufacturing environment or otherwise. The device 104 travels along a track 102 and a sidetrack 106, and the system 100 includes an inspection component 108, a repair component 110, a cleaning component 112, and a controller 114, according to some embodiments. In some embodiments, the device 104 includes a feature 126, such as a belt and pulley system, robotic arm, etc., that selectively engages a carrier 118, such as a front opening unified/universal pod (FOUP), configured to carry the semiconductor wafer 116, such that the device 104 moves the semiconductor wafer 116 to different processing stations 122a, 122b within the semiconductor manufacturing environment. In some embodiments, although two processing stations 122a, 122b are illustrated any number of processing stations are contemplated. According to some embodiments, the device includes an odometer 120 that records the distance traveled by the device 104.

According to some embodiments, the track 102 is made of one or more rails, races, sidewalls, etc. and is configured to accommodate the device 104. According to some embodiments, the device 104 travels along the track 102 with a semiconductor wafer 116 in the carrier 118. According to some embodiments, the device 104 is maintained on the track 102 using guide rails, guard rails, etc. The track 102 forms a pathway for the device 104 to travel from one location to another location within the semiconductor manufacturing environment. The semiconductor manufacturing environment includes one or more processing stations 122a, 122b where different semiconductor fabrication processes are performed at the different stations. According to some embodiments, the track 102 interconnects multiple processing stations 122a, 122b and allows the device 104 to move between the processing stations 122a, 122b thus transporting the semiconductor wafer 116 to and from the different processing stations 122a, 122b. According to some embodiments, the track 102 is constructed of metal, phenolic, nylon, etc. In some embodiments, at least some of the track 102 is suspended from a ceiling. In some embodiments, at least some of the track 102 is erected from at least one of a floor or a wall. In some embodiments, at least some of the track 102 is erected using a lattice support structure.

According to some embodiments, the system 100 includes a transfer component 124, such as a switch, turnout, etc. that facilitates transfer of the device 104 from travelling along the track 102 to travelling along the sidetrack 106 and vice versa. In some embodiments, the transfer component 124 facilitates movement of the device 104 to at least one of the inspection component 108, the repair component 110, or the cleaning component 112. According to some embodiments, although the inspection component 108, the repair component 110, and the cleaning component 112 are illustrated in series any number of arrangements are contemplated. In some embodiments, the repair component 110 and the cleaning component 112 are downstream of the inspection component 108 but are in parallel such that after being inspected at the inspection component 108 the device 104 is able to move directly to either the repair component 110 or the cleaning component 112.

According to some embodiments, the sidetrack 106 is constructed of metal, phenolic, nylon, etc. In some embodiments, at least some of the sidetrack 106 is constructed of a same material(s) as the track 102. In some embodiments, at least some of the sidetrack 106 is constructed of a different material(s) than the track 102. In some embodiments, at least some of the sidetrack 106 is suspended from a ceiling. In some embodiments, at least some of the sidetrack 106 is erected from at least one of a floor or a wall. In some embodiments, at least some of the sidetrack 106 is erected using a lattice support structure. In some embodiments, at least some of the sidetrack 106 is constructed in a same manner as the track 102. In some embodiments, at least some of the sidetrack 106 is constructed in a different manner than the track 102.

In some embodiments, the device 104 is self-propelled, such as a motorized vehicle. In some embodiments, at least some of at least one of the track 102 or the sidetrack 106 includes a conveyance mechanism such as a chain, belt, motor, compressed air, etc. that moves the device 104 along the track. In some embodiments, at least some of the relative motion between the device 104 and at least one of the track 102 or the sidetrack 106 is attributable to the conveyance mechanism. Other embodiments are contemplated and the instant disclosure is not limited to the just described embodiments.

According to some embodiments, the controller 114 maintains a record of the device 104 including, but not limited to, distance traveled by the device 104, time elapsed since a last maintenance action on the device 104, etc. In some embodiments, the distance traveled is determined using the odometer 120 located on at least one of the device 104 or the controller 114. In some embodiments, the distance traveled by the device 104 is determined by monitoring an identifier 128 located on at least one of the device 104 or the track 102. In some embodiments, the identifier is located on the track 102 and is sensed by a sensor on the device 104 as the device 104 passes by the identifier. In some embodiments, the identifier is located on the device 104 and is sensed by a sensor on the track 102 as the device 104 passes by the sensor. In some embodiments, at least one of a first identifier or a first sensor is located on the track 102 and at least one of a second identifier or a second sensor is located on the device 104 and the first identifier/sensor and the second identifier/sensor interact with one another as the device 104 moves relative to the track to yield an indication of distance travelled by the device. In some embodiments, the identifier is a bar code, QR code, RF ID tag, mechanical protrusion, etc. In some embodiments, data is sent from the device 104 to the controller 114, such as for determining the device is to be inspected due to the distance travelled by the device exceeding a distance threshold. In some embodiments, data is sent from the controller 114 to the device 104, such as for determining the device is to be inspected due to the distance travelled by the device exceeding a distance threshold.

In some embodiments, the controller 114 controls the transfer component 124 that facilitates transfer of the device 104 from travelling along the track 102 to travelling along the sidetrack 106 and vice versa. In some embodiments, the controller 114 controls the operation of at least one of the inspection component 108, the repair component 110, or the cleaning component 112. In some embodiments, the controller 114 is a computing device having a processor and memory that determines the status of the device 104, such as distance travelled, etc. In some embodiments, the controller 114 includes a display for displaying information about the device, such as distance travelled by the device, date/time of/since one or more inspections of the device, date/time of/since one or more repairs to the device, date/time of/since one or more cleanings of the device, information about at least one of inspection(s), repair(s), or cleaning(s), such as at least one of what part or parts of the device were inspected, what part or parts of the device were repaired, or what part or parts of the device were cleaned, etc.

According to some embodiments, the controller 114 determines whether the distance travelled by the device exceeds a distance threshold such that inspection of the device is due because of an amount of likely wear of the device. According to some embodiments, when the distance travelled by the device exceeds the distance threshold the device 104 is routed to a transfer point where the device 104 is taken off of the track 102 and sent to the sidetrack 106, such as by the transfer component 124. According to some embodiments, the device 104 is moved to the inspection component 108. According to some embodiments, the inspection component 108 inspects the device 104, such as for a degree of wear of the one or more wheels 130 of the device 104, a level of cleanliness of the device 104, etc. According to one or more embodiments, if one or more readings, findings, etc. of the inspection component 108 indicate that the device 104 should be repaired, the device 104 is sent to the repair component 110 for repair. According to one or more embodiments, if one or more readings, findings, etc. of the inspection component 108 indicate that the device 104 should be cleaned, the device 104 is sent to the cleaning component 112 for cleaning. According to one or more embodiments, if one or more readings, findings, etc. of the inspection component 108 do not indicate that the device 104 should be at least one of cleaned or repaired, the device 104 is simply routed back to the track 102 from the sidetrack 106, such as by the transfer component 124. According to one or more embodiments, if the device 104 is routed to at least one of the repair component 110 or the cleaning component 112, the device 104 is thereafter routed back to the track 102 from the sidetrack 106, such as by the transfer component 124, to resume conveying the semiconductor wafer 116 to various processing stations 122a, 122b.

Figure 2:
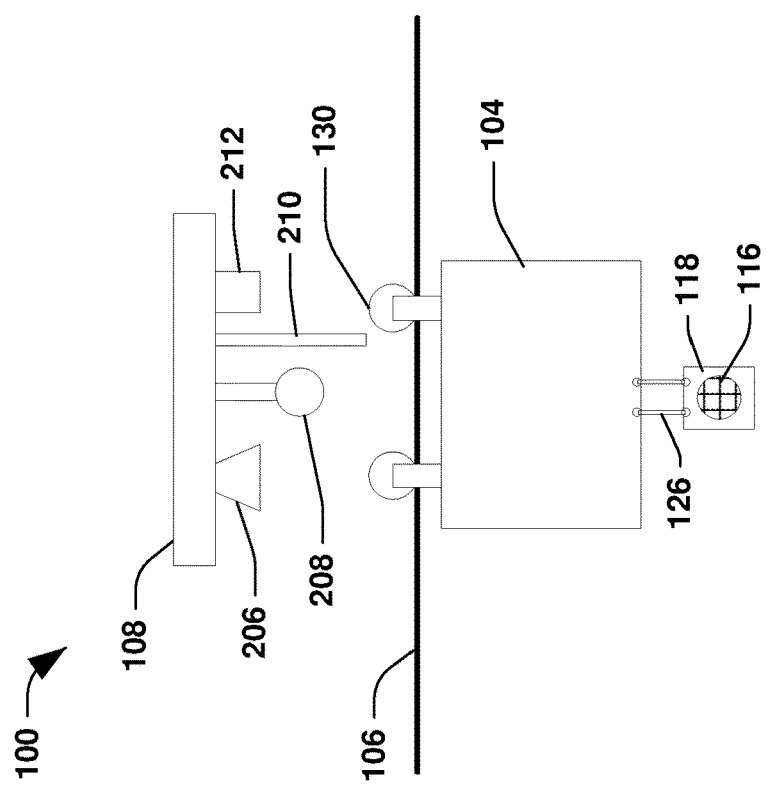
FIG. 2 illustrates a device undergoing an inspection by an inspection component, according to some embodiments.

FIG. 2 illustrates the system 100 with the device 104 undergoing an inspection by the inspection component 108, according to some embodiments. In some embodiments, the device 104 is suspended from the sidetrack 106 by wheels 130 of the device 104. According to some embodiments, the inspection component 108 is configured to inspect the device 104 and determine at least one of wear of the device 104 or cleanliness of the device 104. According to some embodiments, the inspection component 108 includes one or more sensors to generate, store, etc. data regarding the status of the device 104. According to one or more embodiments, the sensors include at least one of a camera 206, a transmitter/receiver 208, such as RF, laser, etc., a physical contact 210, such as a brush, or a bar code reader 212.

In some embodiments, the inspection component 108 employs the bar code reader 212 to identify the device 104, such as to verify that the correct device from among a plurality of devices is being inspected, such as according to an instruction from the controller 114. In some embodiments, the inspection component 108 uses the bar code reader 212 to tag or associate data with the device 104 under inspection.

According to some embodiments, the wear the device 104 is related to a dimension, characteristic, etc. of the wheel 130 of the device 104. In some embodiments, the inspection component 108 uses at least one of the camera 206, the transmitter/receiver 208, or the physical contact 210 to determine at least one of a diameter of a wheel 130, a circumference of a wheel 130, a depth, width, size, shape, area, volume, etc. of a crack, opening, fissure, void, impression, depression, etc. in a wheel 130, a flatness of a wheel 130, a concentricity of a wheel 130, a concavity of a wheel 130, a surface roughness of a wheel 130, etc. According to some embodiments, the wear of the device is related to a change of one or more of the foregoing, such as a reduction or a rate of a reduction in the diameter of a wheel 130 of the device 104.

According to some embodiments, the wear the device 104 is related to a dimension, characteristic, etc. of the feature 126 that selectively engages the carrier 118. In some embodiments, the inspection component 108 uses at least one of the camera 206, the transmitter/receiver 208, or the physical contact 210 to determine at least one of a thickness, a flatness, a surface roughness, etc. of the feature 126. In some embodiments, a ridges, grooves, bumps, etc. are implemented to facilitate the feature 126 engaging the carrier 118 such that an absence or reduction in the same inhibits an ability of the feature 126 to engage the carrier 118. According to some embodiments, the wear of the device is related to a change of one or more of the foregoing, such as a reduction or a rate of a reduction of the surface roughness of the feature 126 of the device 104.

According to some embodiments, the cleanliness of the device 104 is related to particles or other debris on or associated with the device 104. In some embodiments, the inspection component 108 uses at least one of the camera 206, the transmitter/receiver 208, or the physical contact 210 to determine at least one of a quantity, type, size, location, concentration, distribution, area, volume, average size, etc. of debris on the device, such as on a wheel 130 of the device 104. In some embodiments, the inspection component 108 determines whether debris are in a wheel groove that receives at least one of the track 102 or the sidetrack 106 such that the debris would affect movement of the device 104 within the semiconductor manufacturing environment. According to some embodiments, the cleanliness of the device 104 is related to a change of one or more of the foregoing, such as an accumulation or a rate of accumulation of debris on the device 104.

In some embodiments, the inspection component 108 implements image recognition to determine at least one of device wear or device cleanliness. In some embodiments, the inspection component 108 sends the sensor data, such as tagged using uses the bar code reader 212, to the controller 114. In some embodiments, a determination as to whether the device 104 should be at least one of cleaned or repaired is made at least in part by the controller 114. In some embodiments, a determination as to whether the device 104 should be at least one of cleaned or repaired is made at least in part by the inspection component 108. According to some embodiments, at least one of the controller 114 or the inspection component 108 provides at least one of a repair indication indicating that the device 104 should undergo repair or a clean indication indicating that the device 104 should undergo cleaning. In some embodiments, a determination that the device should undergo cleaning is a function of whether a cleanliness of the device meets or does not meet a cleanliness threshold, such as particles per unit area exceeding a threshold. In some embodiments, a determination that the device should undergo repair is a function of whether wear of the device meets or does not meet a wear threshold, such as at least one of a diameter of a wheel falling below a minimum diameter or a thickness of the feature 126 falling below a thickness threshold.

Figure 3:
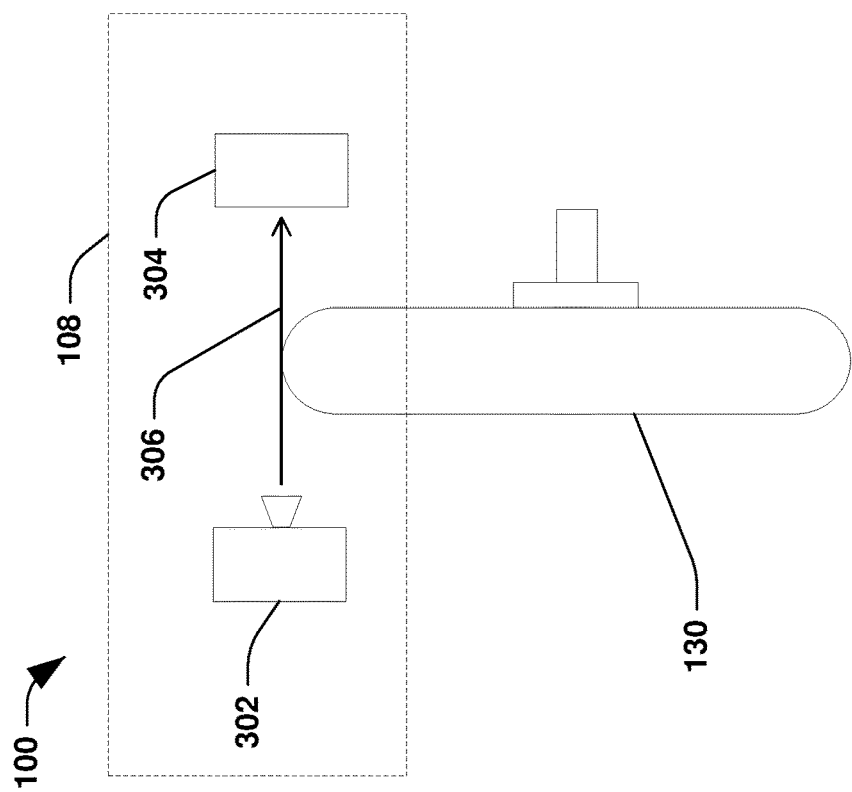
FIG. 3 illustrates a sensor employing a laser transmitter and receiver for measuring an amount of wear of a wheel, according to some embodiments.

FIG. 3 illustrates the system 100 with a wheel 130 of the device 104 undergoing laser inspection by the inspection component 108, according to some embodiments. In some embodiments, the inspection component 108 employs a laser transmitter 302 and receiver 304 for measuring an amount of wear of a wheel 130, according to some embodiments. The laser transmitter 302 is configured to send a laser beam 306 through a region of space to the receiver 304. The wheel 130 is positioned between the laser transmitter 302 and receiver 304. When the wheel 130 is of sufficient diameter, such as when the wheel 130 is new, the laser beam 306 is interrupted or blocked by the wheel such that the receiver 304 does not detect the laser beam 306. According to some embodiments, a signal is generated indicating that the wheel 130 exceeds a minimum diameter. When, however, the wheel 130 has worn such that the laser beam 306 is not interrupted or blocked by the wheel the receiver 304 detects the laser beam 306. According to some embodiments, a signal is generated indicating that the wheel 130 does not exceed a minimum diameter. In some embodiments, the device 104 is routed to the repair component 110 for wheel replacement.

According to some embodiments, the laser transmitter 302 and receiver 304 are used to measure the concentricity of the wheel 130 by rotating the wheel 130 and sensing when the wheel 130 interrupts the laser beam 306 and when the wheel 130 does not interrupt the laser beam 306. In some embodiments, uneven wear or non-concentricity of the wheel is determined when the laser beam 306 is not consistently blocked or unblocked by the wheel. According to some embodiments, when the concentricity of the wheel 130 falls below a concentricity threshold, such that the wheel is not sufficiently round, the wheel is replaced.

Figure 4:
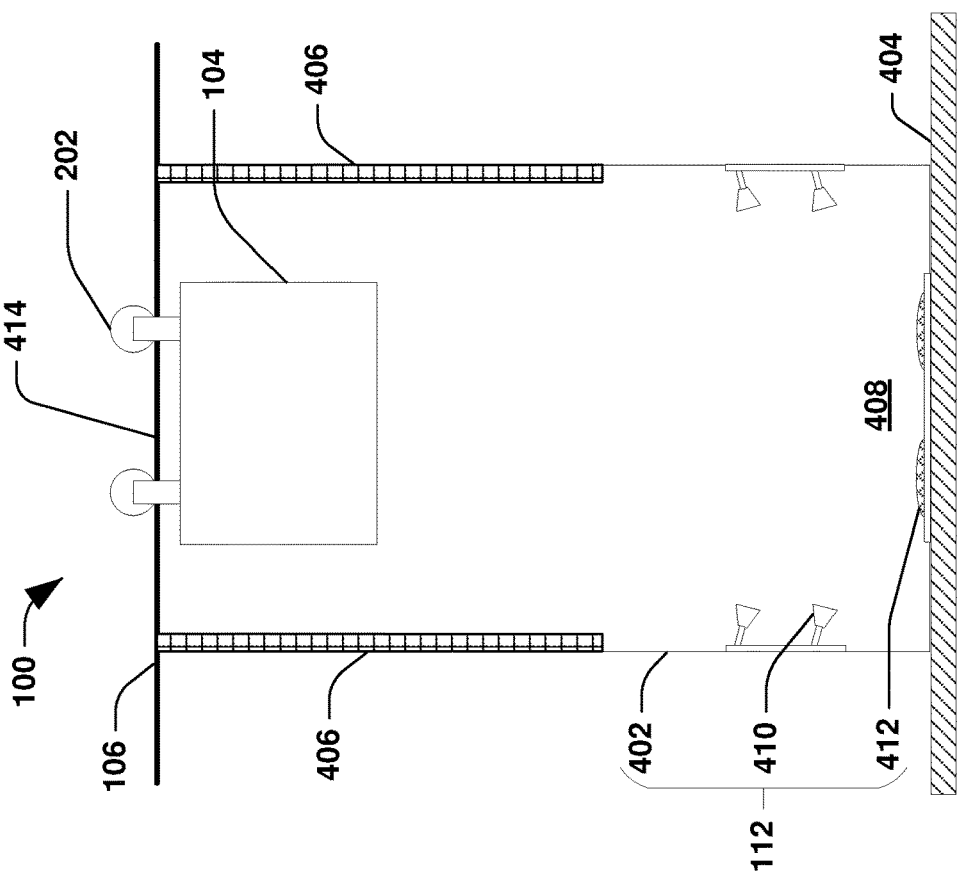
FIG. 4 illustrates a device on a sidetrack prior to entering a cleaning component, according to some embodiments.

FIG. 4 illustrates the system 100 with the device 104 in the cleaning component 112, according to some embodiments. In some embodiments, the cleaning component 112 is configured to clean device 104 where the device 104 is lowered into the cleaning component 112 via a lift mechanism 406. According to some embodiments, the lift mechanism 406 is at least one of a chain-driven elevator, hydraulic lift, mechanical crane, etc. that lowers/raises a section 414 of the sidetrack 106 to which the device 104 is attached. In some embodiments, the cleaning component 112 includes a support structure 402 resting on a foundation 404, such as a floor of the semiconductor manufacturing environment, the lift mechanism 406 for moving the device 104 into and out of the cleaning component 112, one or more spray heads 410, and a removal region 408, such as including one or more vents 412.

Figure 5:
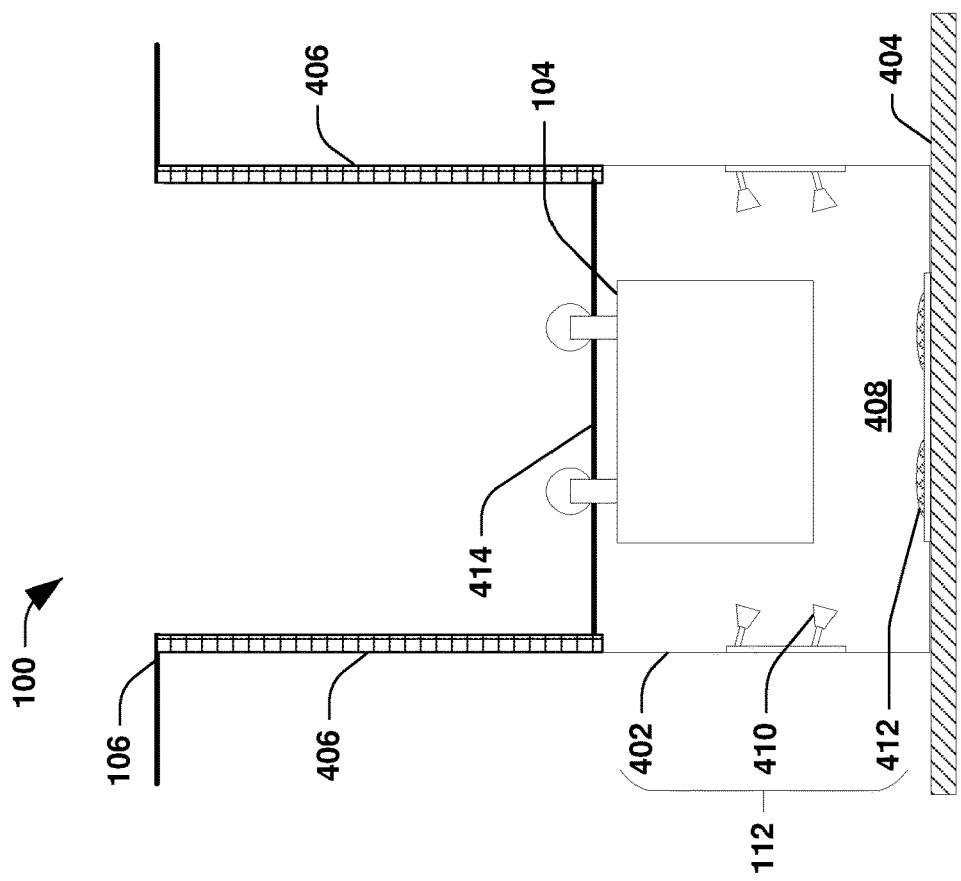
FIG. 5 illustrates a device within a cleaning component, according to some embodiments.

FIG. 5 illustrates the system 100 with the device 104 and the section 414 of the sidetrack 106 lowered into the cleaning component 112 by the lift mechanism 406. According to some embodiments, the cleaning component 112 uses at least one of gas, liquid, solid, or vacuum to clean the device 104. In some embodiments, at least one of the gas, liquid, or solid is directed, such as under pressure, toward the device 104 to dislodge, remove, etc. debris from the device 104. In some embodiments, one or more of the spray heads 410 direct at least one of the gas, liquid, or solid toward the device 104. In some embodiments, at least one of the one or more spray heads 410 move, such as independently, so as to direct a substance to a targeted location on the device 104. In some embodiments, relative movement between the lift mechanism 406 and at least one of the one or more spray heads 410 is cooperatively controlled, such as by the controller 114, to increase the likelihood of the substance impacting the device 104 at the targeted location.

In some embodiments, a first spray head 410 directs a gas, such as air, toward the device 104. In some embodiments, a second spray head 410 directs a liquid, such as water, toward the device 104. In some embodiments, a third spray head 410 directs a solid, such as sand, toward the device 104. In some embodiments, at least two of the gas, liquid, or solid are concurrently directed toward the device. In some embodiments, a single spray head 410 directs at least two of the gas, liquid, or solid toward the device 104. According to some embodiments, a detergent is directed toward the device 104, followed by a liquid to interact with the detergent to remove debris from the device, and then followed by a gas to dry the device. In some embodiments, the cleaning component 112 contains a reservoir of cleaner, such as water containing detergent. In some embodiments, the device is immersed one or more times, such as by the lift mechanism 406, into the reservoir to remove debris. In some embodiments, after being immersed in the reservoir, a gas is subsequently directed toward the device 104 to dry the device. In some embodiments, debris from the device 104 fall to the removal region 408. According to some embodiments, the one or more vents 412 create a pressure differential in the cleaning component 112, such as by vacuum, to encourage, draw, etc. the debris into the removal region. In some embodiments, the vents 412 are closed to establish the reservoir in the cleaning component 112. In some embodiments, the vents 412 are opened to drain the reservoir. In some embodiments, at least one of the feature 126, the carrier 118, or the semiconductor wafer 116 is coupled to the device during a cleaning. In some embodiments, at least one of the feature 126, the carrier 118, or the semiconductor wafer 116 is not coupled to the device during a cleaning. In some embodiments, one or more components or operations of the cleaning component 112 are controlled by at least one of the controller 114 or the inspection component 108.

FIG. 6 illustrates the system 100 with the device 104 in association with the repair component 110, according to some embodiments. In some embodiments, the repair component 110 has several repair tools. In some embodiments, the repair component 110 is configured to repair the device 104 based on at least the results from the inspection component 108. According to some embodiments, the repair component 110 includes at least one of a wheel replacement tool 602, a circuit card replacement tool 610, or a fluid insertion tool 620.

In some embodiments, the wheel replacement tool 602 includes a first tool arm 604 that holds a replacement wheel 606 and is configured to remove a wheel 130, such as a worn wheel, from the device 104 and replace the wheel 130 with the replacement wheel 606. In some embodiments, the circuit card replacement tool 610 includes a second tool arm 612 that holds a replacement circuit card 614 and is configured to remove a circuit card 616, such as an outdated circuit card, from the device 104 and replace the circuit card 616 with the replacement circuit card 614. The fluid insertion tool 620 includes a third tool arm 622 coupled to a dispensing arm 624 and is configured to dispense at least one of a gas or a liquid, such as a lubricant, to the device 104. In some embodiments, at least one of the feature 126, the carrier 118, or the semiconductor wafer 116 is coupled to the device during a repair. In some embodiments, at least one of the feature 126, the carrier 118, or the semiconductor wafer 116 is not coupled to the device during a repair. In some embodiments, one or more components or operations of the repair component 110 are controlled by at least one of the controller 114 or the inspection component 108.

Device maintenance in a semiconductor manufacturing environment is provided. The device moves on or relative to a track within the semiconductor manufacturing environment. The device conveys one or more semiconductor wafers between various stations within the semiconductor manufacturing environment to expose the wafers to different semiconductor fabrication processes. As the device moves within the semiconductor manufacturing environment one or more components of the device wear, such as wheels of the device that contact the track. According to some embodiments, the device is inspected after travelling a certain distance, such as a distance likely to result in wear of the device. Inspecting the device based upon distance travelled inhibits unnecessary inspections, such as where the device is inspected too frequently or before the device is likely to exhibit wear. Inspecting the device based upon distance travelled promotes timely inspections, such as where substantial use of the device occurs in a relatively short period of time such that the device quickly exhibits wear. Responsive to a repair indication, a repair operation, such as replace a worn wheel, is performed on the device. Responsive to a clean indication, a cleaning operation, such as removing debris, is performed on the device. At least one of the operations, such as determining distance travelled by the device, inspecting the device, cleaning the device, or repairing the device, is performed automatically or programmatically with little to no human intervention.

Still another embodiment involves a computer-readable medium comprising processor-executable instructions configured to implement one or more of the techniques presented herein. An exemplary computer-readable medium is illustrated in FIG. 7, wherein the implementation 700 comprises a computer-readable medium 708 (e.g., a CD-R, DVD-R, flash drive, a platter of a hard disk drive, etc.), on which is encoded computer-readable data 706. This computer-readable data 706 in turn comprises a set of processor-executable computer instructions 704 configured to operate according to one or more of the principles set forth herein. In some embodiments, the processor-executable computer instructions 704 are configured to perform a method 702, such as at least some of the aforementioned described methods. In some embodiments, the processor-executable computer instructions 704 are configured to implement a system, such as at least some of the aforementioned systems. Many such computer-readable media may be devised by those of ordinary skill in the art that are configured to operate in accordance with the techniques presented herein.

Figure 8:
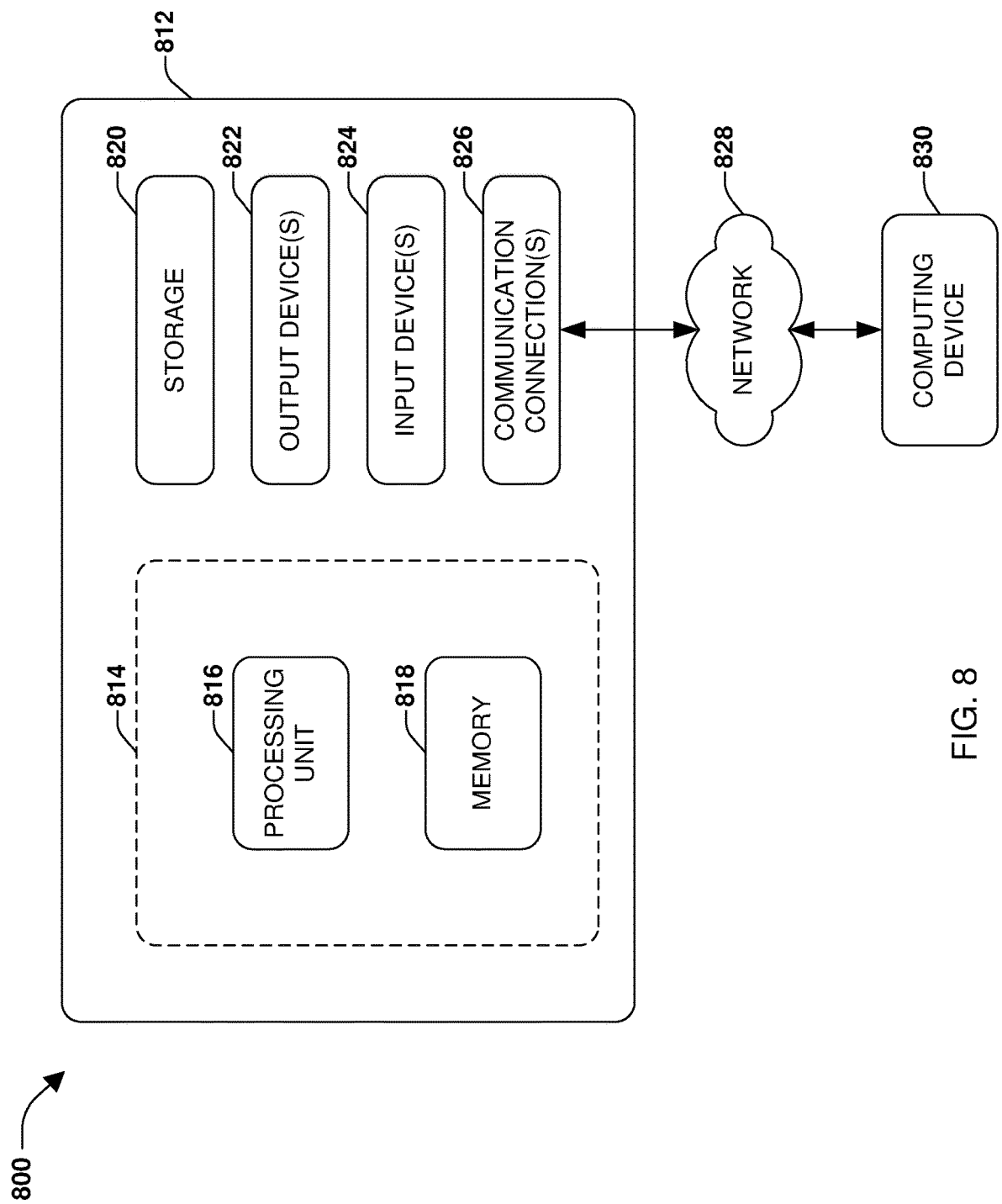
FIG. 8 illustrates an example computing environment wherein one or more of the provisions set forth herein may be implemented, according to some embodiment.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 depicts an example of a system 800 comprising a computing device 812 configured to implement some embodiments provided herein. In some configurations, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In some embodiments, computing device 812 may include additional features and/or functionality. For example, computing device 812 may also include additional storage (e.g., removable and/or non-removable) including, but not limited to, magnetic storage, optical storage, and the like. Such additional storage is illustrated in FIG. 8 by storage 820. In some embodiments, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 812. Any such computer storage media may be part of computing device 812.

Computing device 812 may also include communication connection(s) 826 that allows computing device 812 to communicate with other devices. Communication connection(s) 826 may include, but is not limited to, a modem, a Network Interface Card (NIC), an integrated network interface, a radio frequency transmitter/receiver, an infrared port, a USB connection, or other interfaces for connecting computing device 812 to other computing devices. Communication connection(s) 826 may include a wired connection or a wireless connection. Communication connection(s) 826 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in computing device 812. Input device(s) 824 and output device(s) 822 may be connected to computing device 812 via a wired connection, wireless connection, or any combination thereof. In some embodiments, an input device or an output device from another computing device may be used as input device(s) 824 or output device(s) 822 for computing device 812.

Components of computing device 812 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 812 may be interconnected by a network. For example, memory 818 may be comprised of multiple physical memory units located in different physical locations interconnected by a network.

Those skilled in the art will realize that storage devices utilized to store computer readable instructions may be distributed across a network. For example, a computing device 830 accessible via a network 828 may store computer readable instructions to implement one or more embodiments provided herein. Computing device 812 may access computing device 830 and download a part or all of the computer readable instructions for execution. Alternatively, computing device 812 may download pieces of the computer readable instructions, as needed, or some instructions may be executed at computing device 812 and some at computing device 830.

As used in this application, the terms "component," "module," "system", "interface", and/or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

According to some embodiments, a system for maintaining a device in a semiconductor manufacturing environment includes a controller configured to determine a distance travelled by the device within the semiconductor manufacturing environment, where the device includes a feature that selectively engages a carrier configured to carry a semiconductor wafer such that the device moves the semiconductor wafer to different processing stations within the semiconductor manufacturing environment. The system includes an inspection component configured to inspect the device responsive to the distance travelled by the device exceeding a distance threshold, a repair component configured to repair the device responsive to a repair indication from at least one of the controller or the inspection component, and a cleaning component configured to clean the device responsive to a clean indication from at least one of the controller or the inspection component.

According to some embodiments, a method of maintaining a device in a semiconductor manufacturing environment includes determining a distance traveled by the device within the semiconductor manufacturing environment, where the device includes a feature that selectively engages a carrier configured to carry a semiconductor wafer such that the device moves the semiconductor wafer to different processing stations within the semiconductor manufacturing environment. The method includes inspecting the device responsive to the distance travelled by the device exceeding a distance threshold, and at least one of repairing the device responsive to a repair indication resulting from the inspecting or cleaning the device responsive to a clean indication resulting from the inspecting.

According to some embodiments, a system for maintaining a device in a semiconductor manufacturing environment includes a cleaning component configured to use at least one of gas, liquid, solid, or vacuum to remove debris from the device, where the device travels within the semiconductor manufacturing environment and has a feature that selectively engages a carrier configured to carry a semiconductor wafer such that the device moves the semiconductor wafer to different processing stations within the semiconductor manufacturing environment.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components the terms used to describe such components are intended to correspond, unless otherwise indicated, to any component which performs the specified function of the described component (for example, a term that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system, comprising:
a carrier configured to carry a semiconductor wafer;
a device configured to selectively engage the carrier;
a track configured to receive the device, wherein the track extends between a first processing station and a second processing station within a semiconductor manufacturing environment to enable transport of the semiconductor wafer, via the carrier engaged with the device, between the first processing station and the second processing station;
a controller configured to determine a distance traveled by the device along the track;
a sidetrack coupled to the track;
a first transfer component, in communication with the controller, and configured to transfer the device from the track to the sidetrack responsive to the controller indicating that the distance traveled by the device exceeds a distance threshold; and
a repair component disposed along the sidetrack and configured to repair the device upon the device being transferred from the track to the sidetrack.

2. The system of claim 1, comprising:
an inspection component disposed along the sidetrack and configured to inspect the device upon the device being transferred from the track to the sidetrack prior to the device being repaired.

3. The system of claim 1, comprising:
a cleaning component disposed along the sidetrack and configured to clean the device, wherein the cleaning component comprises a lift mechanism configured to move the device in a direction perpendicular to a pathway of the sidetrack.

4. The system of claim 3, wherein the sidetrack comprises a first section coupled to the lift mechanism and detachable from a second section of the sidetrack.

5. The system of claim 1, comprising a second transfer component configured to transfer the device from the sidetrack to the track.

6. The system of claim 5, wherein the repair component is between the first transfer component and the second transfer component along a pathway of the sidetrack.

7. The system of claim 1, comprising:
a sensor coupled to at least one of the device or the track; and
an identifier coupled to at least one of the device or the track, wherein the controller is configured to determine the distance traveled by the device based upon a sensing of the identifier by the sensor.

8. The system of claim 1, wherein the device comprises an odometer and the controller is configured to determine the distance traveled by the device based upon the odometer.

9. The system of claim 1, comprising:
an inspection component configured to inspect cleanliness of the device, wherein the cleanliness of the device corresponds to at least one of:
a size of a particle on the device; or
a number of particles on the device.

10. The system of claim 1, comprising:
an inspection component configured to inspect wear of the device, wherein the wear of the device corresponds to at least one of:
a diameter of a wheel of the device;
a depth of a crack in the wheel of the device;
a width of the crack in the wheel of the device; or
a flatness of a feature of the device that selectively engages the carrier.

11. The system of claim 10, wherein the inspection component is configured to at least one of:
utilize image recognition to determine at least one of the depth or the width;
utilize a laser to determine the diameter; or
utilize a contact sensor to determine the flatness.

12. The system of claim 1, wherein the repair component comprises a wheel replacement tool comprising a tool arm configured to replace a wheel of the device.

13. The system of claim 1, wherein the repair component comprises a circuit card replacement tool comprising a tool arm configured to replace a circuit card of the device.

14. The system of claim 1, wherein the repair component comprises a fluid insertion tool comprising a dispensing arm configured to dispense at least one of a gas or a liquid to the device.

15. A system, comprising:
a carrier configured to carry a semiconductor wafer;
a device configured to selectively engage the carrier;
a track configured to receive the device, wherein the track extends between a first processing station and a second processing station within a semiconductor manufacturing environment to enable transport of the semiconductor wafer, via the carrier engaged with the device, between the first processing station and the second processing station;
a controller configured to determine a distance traveled by the device along the track;
a sidetrack coupled to the track;
a first transfer component, in communication with the controller, and configured to transfer the device from the track to the sidetrack responsive to the controller indicating that the distance traveled by the device exceeds a distance threshold; and
a repair component disposed along the sidetrack and configured to repair the device upon the device being transferred from the track to the sidetrack responsive to a repair indication generated after an inspection of the device.

16. The system of claim 15, wherein the repair component is configured to at least one of:
replace a wheel of the device,
replace a circuit card of the device, or
dispense at least one of a gas or a liquid to the device.

17. The system of claim 15, wherein the sidetrack comprises a first section coupled to a lift mechanism and detachable from a second section of the sidetrack.

18. A system, comprising:
a carrier configured to carry a semiconductor wafer;
a device configured to selectively engage the carrier;
a track configured to receive the device, wherein the track extends between a first processing station and a second processing station within a semiconductor manufacturing environment to enable transport of the semiconductor wafer, via the carrier engaged with the device, between the first processing station and the second processing station;

a controller configured to determine a distance traveled by the device along the track;

a sidetrack coupled to the track;

a first transfer component, in communication with the controller, and configured to transfer the device from the track to the sidetrack responsive to the controller indicating that the distance traveled by the device exceeds a distance threshold; and a repair component disposed along the sidetrack and configured to repair the device upon the device being transferred from the track to the sidetrack, wherein the repair component is configured to at least one of:

replace a wheel of the device, replace a circuit card of the device, or dispense at least one of a gas or a liquid to the device.

19. The system of claim 18, comprising:

an inspection component disposed along the sidetrack and configured to inspect the device upon the device being transferred from the track to the sidetrack prior to the device being repaired.

20. The system of claim 18, comprising:

a cleaning component disposed along the sidetrack and configured to clean the device, wherein the cleaning component comprises a lift mechanism configured to move the device in a direction perpendicular to a pathway of the sidetrack.

* * * * *